United States Patent
Ota (10) Patent No.: US 10,777,632 B2
(45) Date of Patent: Sep. 15, 2020

(54) ELECTRO-OPTICAL DEVICE AND ELECTRONIC APPARATUS

(71) Applicant: SEIKO EPSON CORPORATION, Tokyo (JP)

(72) Inventor: Hitoshi Ota, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/255,950

(22) Filed: Jan. 24, 2019

(65) Prior Publication Data

US 2019/0229178 A1 Jul. 25, 2019

(30) Foreign Application Priority Data

Jan. 25, 2018 (JP) .................. 2018-010420

(51) Int. Cl.
*H01L 27/32* (2006.01)
*G09G 3/3225* (2016.01)
*G09G 3/3275* (2016.01)

(52) U.S. Cl.
CPC ....... *H01L 27/3276* (2013.01); *G09G 3/3225* (2013.01); *G09G 3/3275* (2013.01); *H01L 27/3272* (2013.01); *G09G 2300/0426* (2013.01); *G09G 2300/0465* (2013.01); *G09G 2300/0809* (2013.01); *G09G 2310/0202* (2013.01); *G09G 2310/0297* (2013.01); *G09G 2320/0209* (2013.01)

(58) Field of Classification Search
None
See application file for complete search history.

(56) References Cited

U.S. PATENT DOCUMENTS

| | | | |
|---|---|---|---|
| 2005/0068310 A1 | 3/2005 | Ishii | |
| 2009/0213054 A1 | 8/2009 | Masui | |
| 2009/0289882 A1* | 11/2009 | Masui | G09G 3/3688 345/88 |
| 2011/0102482 A1* | 5/2011 | Ito | G09G 3/3688 345/690 |
| 2013/0120341 A1* | 5/2013 | Kasai | G09G 3/3233 345/211 |
| 2013/0257698 A1* | 10/2013 | Toya | G09G 3/3241 345/77 |
| 2014/0285411 A1 | 9/2014 | Tamura et al. | |
| 2016/0055804 A1* | 2/2016 | Kitadani | G09G 3/3233 345/214 |

FOREIGN PATENT DOCUMENTS

| | | |
|---|---|---|
| JP | 2005-077484 A | 3/2005 |
| JP | 2009-198874 A | 9/2009 |
| JP | 2014-186125 A | 10/2014 |

* cited by examiner

*Primary Examiner* — Khaja Ahmad
(74) *Attorney, Agent, or Firm* — Oliff PLC (57) ABSTRACT

An electro-optical device includes a first circuit configured to supply a first data signal to a first pixel circuit through a first data transmission line, a second circuit configured to supply a second data signal to a second pixel circuit through a second data transmission line, a first signal line connected to the first circuit, and a second signal line connected to the second circuit. One of the first signal line and the second signal line is at least partially formed in a wiring layer that differs from that of the other.

12 Claims, 8 Drawing Sheets

ELECTRO-OPTICAL DEVICE AND ELECTRONIC APPARATUS

BACKGROUND

1. Technical Field

The present invention relates to an electro-optical device and an electronic apparatus.

2. Related Art

Electro-optical devices that include a display unit provided with pixels circuits arranged in a matrix in correspondence with positions of pixels where scanning lines and data lines intersect are wide spread. These pixel circuits each include a light-emitting element such as an organic light-emitting diode (OLED), a transistor, and the like. In JP-A-2014-186125, a layout is disclosed in which circuit blocks configured to supply data signals corresponding to display gradations to pixel circuits adjacent to each other in a wiring direction of scanning lines (hereinafter "row direction") are disposed side-by-side in a wiring direction of data transmission lines (hereinafter "column direction"). Further, in JP-A-2014-186125, there is disclosed an arrangement of shield lines disposed between the data transmission lines to suppress crosstalk between the data transmission lines adjacent to each other.

In recent years, advances have been made in narrowing a pitch of a pixel in association with demands for higher definition in electro-optical devices. As the pitch of the pixel becomes narrower, the interval between data transmission lines in the row direction also becomes narrower, making it difficult to dispose the shield lines between the data transmission lines. When the shield lines are not disposed between the data transmission lines, the crosstalk between adjacent data transmission lines cannot be adequately suppressed. As a result, the pixel circuits cannot emit light in a desired color or at a desired brightness, causing a reduction in display quality. That is, in the electro-optical device in the related art, there exists a trade-off relationship between narrowing the pitch of the pixel and suppressing crosstalk, resulting in a problem that the electro-optical device cannot be provided with higher definition without a reduction in display quality.

SUMMARY

According to an aspect of the invention, an electro-optical device for resolving the above-described problems includes a first circuit configured to supply a data signal corresponding to a display gradation to a first pixel circuit through a first data transmission line, a second circuit configured to supply a data signal corresponding to a display gradation to a second pixel circuit through a second data transmission line disposed side-by-side with the first data transmission line, a first signal line connected to the first data transmission line in the first circuit, and a second signal line connected to the second data transmission line in the second circuit. The first circuit and the second circuit are disposed side-by-side in a direction of the first data transmission line. Additionally, one of the first signal line and the second signal line is at least partially formed in a wiring layer that differs from that of the other.

According to this aspect, the first circuit and the second circuit are disposed side-by-side in the direction of the data transmission line (that is, a column direction), making it possible to narrow the pitch of the pixel, that is, provide higher definition. Further, according to this aspect, one of the first signal line and the second signal line is at least partially formed in a wiring layer that differs from that of the other and thus, in comparison with a mode where the first signal line and the second signal line are wired in the same wiring layer, crosstalk between the first signal line and the second signal line is suppressed. As a result, according to this aspect, a reduction in display quality caused by the narrowing of the pixel pitch and crosstalk can be avoided. That is, according to this aspect, the electro-optical device can be provided with higher definition without a reduction in display quality.

According to another aspect of the invention, in the electro-optical device described above, at least one of the first data transmission line and the second data transmission line is partially formed in a wiring layer that differs from that of the other.

According to this aspect, one of the first data transmission line and the second data transmission line is at least partially formed in a wiring layer that differs from that of the other and thus, in comparison with a mode where the first signal line and the second signal line are wired in the same wiring layer, crosstalk between the first data transmission line and the second data transmission line is suppressed without providing a shield line between the first data transmission line and the second data transmission line.

According to a further aspect of the invention, the electro-optical device described above further includes a first wiring layer and a second wiring layer, and the first data transmission line is shorter than the second data transmission line. Further, in the first circuit, the first data transmission line and the first signal line are formed in the first wiring layer, and the second data transmission line is formed in the second wiring layer. Additionally, in the second circuit, the second data transmission line and the second signal line are formed in the first wiring layer, and the first signal line is formed in the second wiring layer.

According to this aspect as well, crosstalk between the first data transmission line and the second data transmission line is suppressed without providing a shield line between the first data transmission line and the second data transmission line, and crosstalk between the first signal line and the second signal line is suppressed without providing a shield line between the first signal line and the second signal line.

According to a still further aspect of the invention, the electro-optical device further includes a metal layer imparted with a first fixed potential between the first wiring layer and the second wiring layer. According to this aspect, the metal layer imparted with a first fixed potential serves as a shield and thus, compared to a mode in which the metal layer is not provided, crosstalk between the first data transmission line and the second data transmission line is further suppressed, and crosstalk between the first signal line and the second signal line is further suppressed.

According to a still further aspect of the invention, the electro-optical device further includes an electrode layer between the metal layer and the second wiring layer. The electrode layer forms along with the metal layer a first storage capacitor configured to hold a voltage corresponding to a display gradation of the first pixel circuit, and a second storage capacitor configured to hold a voltage corresponding to a display gradation of the second pixel circuit. According to this aspect, the electrode layer and the metal layer between the first wiring layer and the second wiring layer can also serve as a storage capacitor, eliminating the need to separately provide a storage capacitor.

According to a still further aspect of the invention, the electro-optical device described above further includes a first shield line imparted with a second fixed potential between the first signal line and the second signal line in the first wiring layer, and a second shield line imparted with the second fixed potential between the first signal line and the second signal line in the second wiring layer. The first and the second shield lines shield one of the first signal line and the second shield line from the other. Thus, according to this aspect, crosstalk between the first signal line and the second signal line is further suppressed in comparison with a mode where the first shield line and the second shield line are not provided.

According to a still further aspect of the invention, in the electro-optical device described above, the first shield line and the second shield line are formed in the metal layer and are connected through a relay electrode that is peripherally insulated.

Further, in addition to the electro-optical device, the invention may be conceived as an electronic apparatus including the electro-optical device. Typical examples of the electronic apparatus include display devices such as a head mounted display (HMD) and an electronic viewfinder.

BRIEF DESCRIPTION OF THE DRAWINGS

The invention will be described with reference to the accompanying drawings, wherein like numbers reference like elements.

DESCRIPTION OF EXEMPLARY EMBODIMENTS

A. Exemplary Embodiment

An exemplary embodiment of the invention is described below with reference to the drawings. However, in each view, the dimensions and the scale of each unit are appropriately different from the actual ones. In addition, since the embodiments described below are preferred specific examples of the invention, various technically preferable limitations are given, but in the following description, the scope of the invention is not limited to these forms unless otherwise stated to limit the invention.

Figure 1:
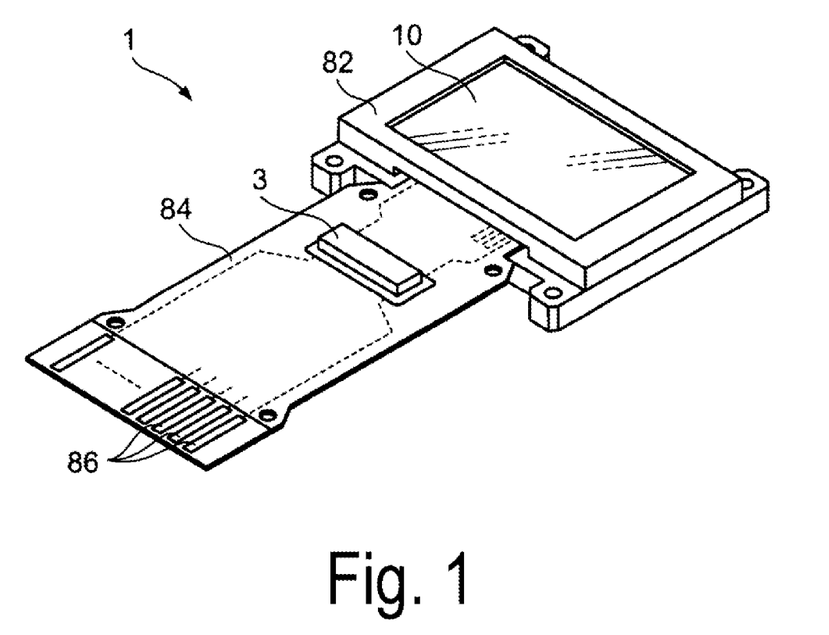
FIG. 1 is a perspective view illustrating a configuration of an electro-optical device 1 according to an exemplary embodiment of the invention.

FIG. 1 is a perspective view illustrating a configuration of an electro-optical device 1 according to an exemplary embodiment of the invention. The electro-optical device 1 is a micro display configured to display an image in a head mounted display, for example.

As illustrated in FIG. 1, the electro-optical device 1 includes a display panel 10 and a control circuit 3 configured to control the operation of the display panel 10. The display panel 10 includes a plurality of pixel circuits, and a drive circuit for driving the pixel circuits. In the exemplary embodiment, the plurality of pixel circuits and the drive circuit of the display panel 10 are formed in a silicon substrate, and an OLED, which is an example of an electro-optical element, is used in the pixel circuits. Further, the display panel 10 is housed in a case 82 having a frame shape opening at a display unit, and is connected to one end of a flexible printed circuit (FPC) substrate 84. In the FPC substrate 84, the control circuit 3 of a semiconductor chip is mounted using a chip on film (COF) technique, and a plurality of terminals 86 are provided and connected to an upper circuit (not illustrated).

Figure 2:
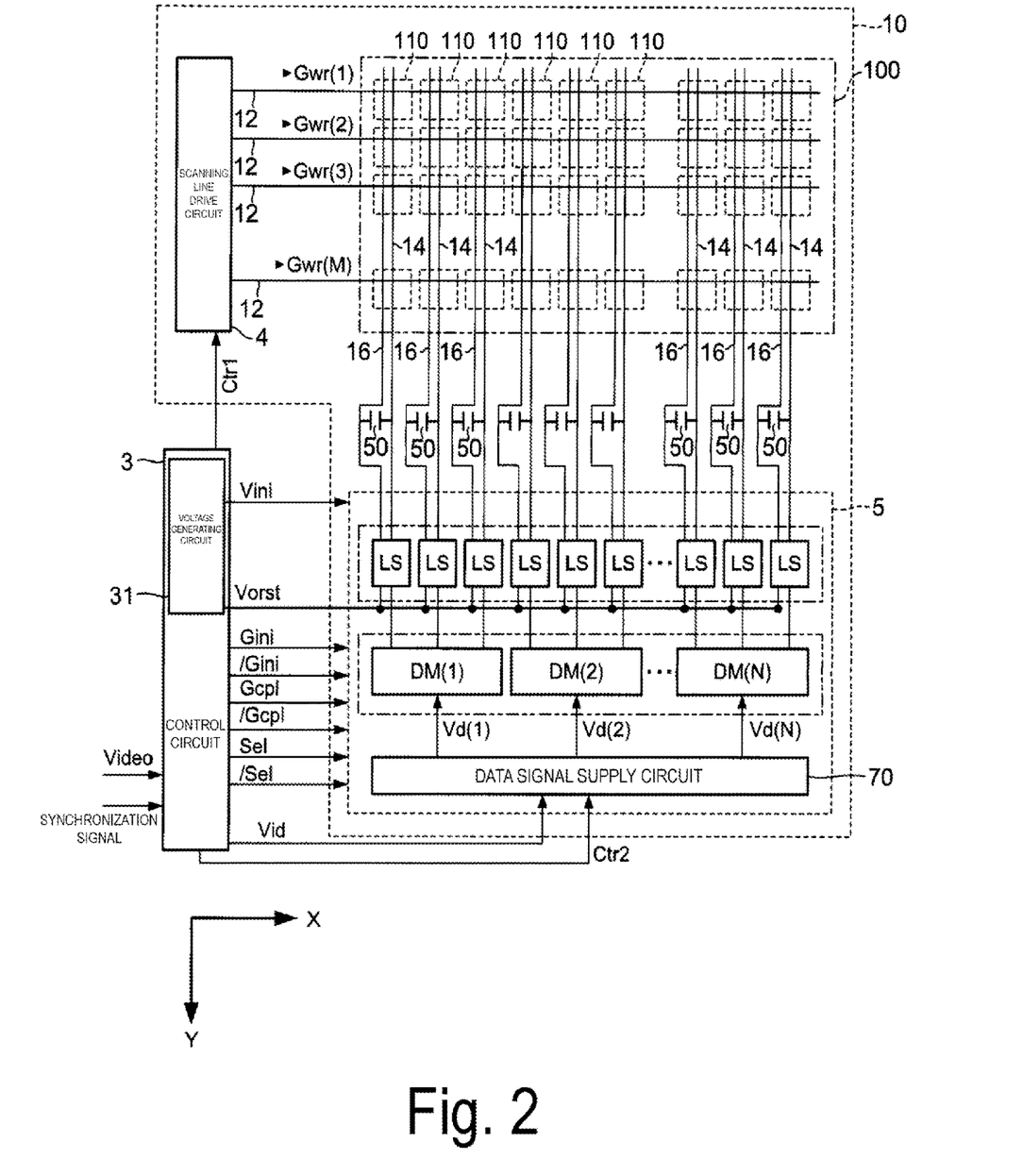
FIG. 2 is a diagram illustrating an electrical configuration of the electro-optical device 1.

FIG. 2 is a block diagram illustrating a configuration of the electro-optical device 1 according to the exemplary embodiment. As described above, the electro-optical device 1 includes the display panel 10 and the control circuit 3. Digital image data Video is supplied to the control circuit 3 from an upper circuit (not illustrated) synchronously with a synchronization signal. Here, the image data Video is data that defines a display gradation of a pixel of an image to be displayed by a display unit 100 of the display panel 10 in 8 bits, for example. In addition, the synchronization signal is a signal including a vertical synchronization signal, a horizontal synchronization signal, and a dot clock signal.

The control circuit 3 generates various control signals on the basis of the synchronization signal, and supplies the generated control signals to the display panel 10. Specifically, the control circuit 3 supplies control signals Ctr1 to Ctr2, Gini, /Gini, Gcpl, /Gcpl, Sel(1), Sel(2), Sel(3), /Sel(1), /Sel(2), and/Sel(3) to the display panel 10. The control signals Ctr1 to Ctr2 are each a signal that includes a plurality of signals, such as a pulse signal, a clock signal, and an enable signal. The control signal Gini is a control signal of positive logic, and the control signal /Gini is a control signal of negative logic having a relationship of logic inversion with the control signal Gini. The control signal Gcpl is a control signal of positive logic, and the control signal /Gcpl is a control signal of negative logic having a relationship of logic inversion with the control signal Gcpl. The control signal /Sel(1) has a relationship of logic inversion with the control signal Sel(1). Similarly, the control signal /Sel(2) has a relationship of logic inversion with the control signal Sel(2), and the control signal /Sel(3) has a relationship of logic inversion with the control signal Sel(3). Note that the control signals Sel(1), Sel(2), Sel(3) are generally called the control signal Sel, and the control signals /Sel(1), /Sel(2), /Sel(3) are generally called the control signal /Sel. A voltage generating circuit 31 receives power from a power supply circuit (not illustrated), and supplies a reset potential Vorst, an initial potential Vini, and the like to the display panel 10.

In addition, the control circuit 3 generates an analog image signal Vid on the basis of the image data Video. Specifically, a lookup table that associates and stores a potential indicated by the image signal Vid and a brightness of the electro-optical element of the display panel 10 is provided to the control circuit 3. Then, the control circuit 3 generates the image signal Vid indicating the potential corresponding to the brightness of the electro-optical element defined by the image video Video with reference to the lookup table, and supplies the image signal Vid to the display panel 10.

As illustrated in FIG. 2, the display panel 10 includes the display unit 100, and a drive circuit (a scanning line drive circuit 4 and a data transmission line drive circuit 5) configured to drive the display unit 100. While the drive circuit is divided into the scanning line drive circuit 4 and the data transmission line drive circuit 5 in the exemplary embodiment, these may be integrated into a single circuit to constitute the drive circuit. As illustrated in FIG. 2, in the display unit 100, pixel circuits 110 corresponding to the pixels of the image to be displayed are arranged in a matrix. Although a detailed view is omitted in FIG. 2, in the display unit 100, M rows of scanning lines 12 are provided extending in a horizontal direction (X direction) in the diagram, and (3N) columns of data transmission lines 14 grouped into sets of three are provided extending in a vertical direction (Y direction) in the diagram. The scanning lines 12 and the data transmission lines 14 are provided so as to maintain mutual electrical insulation. The pixel circuits 110 are provided correspondingly to intersections of the M rows of scanning lines 12 and the (3N) columns of data transmission lines 14. Thus, in the exemplary embodiment, the pixel circuits 110 are arranged in a matrix with M rows vertically and (3N) columns horizontally.

Here, M and N are both natural numbers. In the matrix of the scanning lines 12 and the pixel circuits 110, in order to distinguish the rows from each other, the rows have been numbered 1, 2, 3, . . . , (M−1), and M in order from the top in the diagram. In the same manner, in order to distinguish the columns of the matrix of the data transmission lines 14 and the pixel circuits 110 from each other, the columns have been numbered 1, 2, 3, . . . , (3N−1), and (3N) in order from the left in the diagram. Here, when an integer n of 1 or greater is used in order to generalize and describe a group of the data transmission lines 14, the data transmission lines 14 of columns (3n−2), (3n−1), and (3n) belong to group n, counting from the left. Three pixel circuits 110 corresponding to scanning lines 12 of the same row and three columns of data transmission lines 14 belonging to the same group respectively correspond to the pixels red (R), green (G), and blue (B), and these three pixels represent one dot of a color image to be displayed. That is, the exemplary embodiment has a configuration in which colors of one dot are represented by adding and mixing colors according to the light emission of the OLEDs corresponding to RGB.

Further, as illustrated in FIG. 2, in the display unit 100, (3N) columns of feed lines 16 are provided extending in the vertical direction, and maintain mutual electrical insulation with the scanning lines 12. A predetermined reset potential Vorst is supplied in common from the voltage generating circuit 31 to each of the feed lines 16. In order to distinguish the columns of the feed lines 16 from each other, the columns have been numbered 1, 2, 3, . . . , (3N), in order from the left in the diagram. The feed lines 16 of columns 1 to 3N are provided correspondingly to the data transmission lines 14 of columns 1 to (3N). As illustrated in FIG. 2, a capacitor 50 is provided between the feed lines 16 of columns j (j=1 to 3N) and the data transmission lines 14 of columns j. The capacitor 50 may be a parasitic capacitor formed between the feed line 16 and the data transmission line 14. Or, the capacitor 50 may be formed by one electrode connected to the feed line 16 and the other electrode connected to the feed line 16 by arranging the one electrode and the other electrode so as to face each other.

The scanning line drive circuit 4 generates scanning signals Gwr for selecting M columns of scanning lines 12 in a single frame period sequentially row by row, in accordance with the control signal Ctr1. In FIG. 2, the scan signals Gwr supplied to the scanning lines 12 of rows 1, 2, 3, . . . , M are respectively denoted by Gwr(1), Gwr(2), Gwr(3), . . . , Gwr(M−1), Gwr(M). Note that the scanning line drive circuit 4, in addition to the scanning signals Gwr(1) to Gwr(M), generates various types of control signals synchronized with the scanning signals Gwr for each row, and supplies these signals to the display unit 100; however, such illustration is omitted in FIG. 2. The frame period refers to a period necessary for the electro-optical device 1 to display one cut of an image. For example, when the frequency of the vertical synchronization signal included in the synchronization signal is 120 Hz, the period is 8.3 milliseconds of one cycle. One cut is also referred to as one frame.

As illustrated in FIG. 2, the data transmission line drive circuit 5 includes (3N) level shift circuits LS provided correspondingly 1:1 with each of (3N) columns of data transmission lines 4, N demultiplexers DM provided to each of three columns of data transmission lines 14 constituting each group, and a data signal supply circuit 70.

The data signal supply circuit 70 generates data signals Vd(1), Vd(2), . . . , Vd(N) on the basis of the control signal Ctr2 and the image signal Vid supplied from the control circuit 3. That is, the data signal supply circuit 70 generates data signals Vd(1), Vd(2), . . . , Vd(N) on the basis of the image signal Vid obtained by time division multiplexing the data signals Vd(1), Vd(2), . . . , Vd(N). Then, the data signal supply circuit 70 respectively supplies the data signals Vd(1), Vd(2), . . . , Vd(N) to the demultiplexers DM corresponding to groups 1, 2, . . . , N.

A configuration of the pixel circuit 110, a level shift circuit LS, and the demultiplexer DM will now be described with reference to FIG. 3. Here, m is a sign used to generally show a row in which the pixel circuit 110 is arranged, and is an integer of 1 or greater and M or less. Since each pixel circuit 110 has the same configuration as the others in electrical terms, here, description will be given taking the pixel circuit 110 of row m, column (3n−2), positioned in row m and positioned in column (3n−2), as an example. The scanning signal Gwr(m) and the control signals Gcmp(m), Gel(m), and Gorst(m) are supplied to the pixel circuit 110 of row m from the scanning line drive circuit 4.

Figure 3:
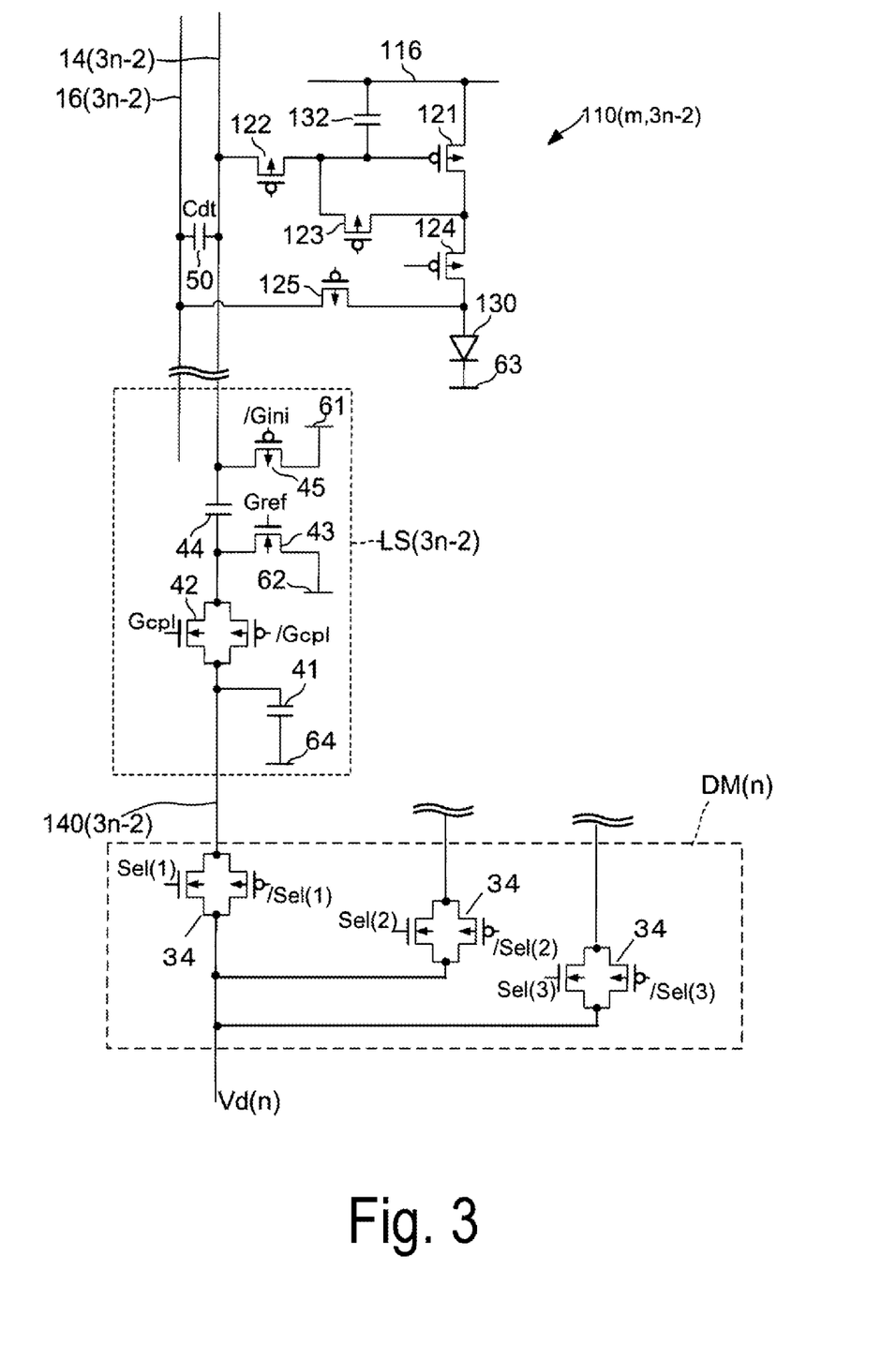
FIG. 3 is a diagram illustrating a configuration example of a pixel circuit 110, a level shift circuit LS, and a demultiplexer DM.

In FIG. 3, the pixel circuit 110 of row m, column (3n−2) is denoted by "110 (m, 3n−2)", and the data transmission line 14 of column (3n−2) is denoted by "14 (3n−2)". Then, in FIG. 3, the level shift circuit LS connected to the data transmission line 14 (3n−2) is denoted by "LS (3n−2)", and the demultiplexer DM connected to the level shift circuit LS (3n−2) is denoted by "DM(n)". The pixel circuit 110 (m, 3n−2) is connected to the data transmission line 14 (3n−2). A gradation voltage corresponding to the display gradation is supplied to the pixel circuit 110 (m, 3n−2) through the data transmission line 14 (3n−2) of the connection destination. The pixel circuit 110 (m, 3n−2) includes a first transistor 121, a second transistor 122, a third transistor 123, a fourth transistor 124, and a fifth transistor 125, each being a P-channel MOS-type transistor, an OLEO 130 as an electro-optical element, and a pixel capacitor 132. In the following, the first transistor 121, the second transistor 122, the third transistor 123, the fourth transistor 124, and the fifth transistor 125 may be generally referred to as the transistors 121 to 125.

A gate of the second transistor 122 is electrically connected to the scanning line 12 (scanning line 12 of row m in the case of the pixel circuit 110 (m, 3n−2)). Further, one of a source or a drain of the second transistor 122 is electrically connected to the data transmission line (data transmission line 14 (3n−2) in the case of the pixel circuit 110 (m, 3n−2)), and the other is electrically connected to a gate of the first transistor 121 and one electrode of the pixel capacitor 132. The second transistor 122 functions as a switching transistor configured to control the electrical connection between the gate of the first transistor 121 and the data transmission line 14 (3n−2).

A source of the first transistor 121 is electrically connected to the feed line 116. A potential Vel which is the high-order side of the power source in the pixel circuit 110 is supplied to a feed line 116 from a power supply circuit (not illustrated). The first transistor 121 functions as a drive transistor in which a current corresponding to the voltage between the gate and source flows to the OLED 130.

One of a source or a drain of the third transistor 123 is electrically connected to the gate of the first transistor 121, and the other is electrically connected to the drain of the first transistor. The control signal Gcmp(m) is provided to a gate of the third transistor 123. The third transistor 123 is a transistor for conducting electric current between the gate and a drain of the first transistor 121. That is, the third transistor 123 functions as a switching transistor configured to control the electrical connection between the gate and the drain of the first transistor 121.

A drain of the fourth transistor 124 is electrically connected to the drain of the first transistor 121, and a source of the fourth transistor 124 is electrically connected to an anode of the OLED 130. The control signal Gel(m) is provided to a gate of the fourth transistor 124. The fourth transistor 124 functions as a switching transistor configured to control the electrical connection between the source of the first transistor 121 and the anode of the OLED 130.

One of a source and a drain of the fifth transistor 125 is electrically connected to the feed line 16 of column (3n−2) (hereinafter "feed line 16 (3n−2)), that is, to a potential line that supplies the reset potential Vorst, and the other is connected to the anode of the OLED 130. The control signal Gorst(m) is supplied to a gate of the fifth transistor 125. The fifth transistor 125 functions as a switching transistor configured to control the electrical connection between the feed line 16 (3n−2) and the anode of the OLED 130.

In the exemplary embodiment, the display panel 10 is formed in a silicon substrate, and therefore a substrate potential of the transistors 121 to 125 is the potential Vel. Further, the sources and the drains of the transistors 121 to 125 in the above switch in accordance with the channel type and potential relationship of the transistors 121 to 125. Further, the transistor may be a thin film transistor or a field effect transistor.

In the pixel capacitor 132, one of the two electrodes is electrically connected to the gate of the first transistor 121, and the other is electrically connected to the feed line 116. Thus, the pixel capacitor 132 functions as a storage capacitor that holds the voltage between the gate and the source of the first transistor 121. Here, as the pixel capacitor 132, a capacitor which is parasitic to the gate of the first transistor 121 may be used, and a capacitive element formed by interposing an insulating layer with mutually different conductive layers in a silicon substrate may be used.

The anode of the OLED 130 is a pixel electrode provided individually for each pixel circuit 110. In contrast, the cathode of the OLED 130 is a common electrode commonly provided across all of the pixel circuits 110, and is connected to a feed line 63. A potential Vct, which is a fixed potential, is supplied to the feed line 63. Here, the potential Vct may be equivalent to an L level of the scanning signal and the control signal, which are logic signals. The OLED 130 is an element in which a white organic electroluminescent (EL) layer is sandwiched between the anode and a cathode of the OLED 130, the cathode having light permeability, in the above-described silicon substrate. Then, a color filter corresponding to any one of RGB is superimposed on the emission side (cathode side) of the OLED 130. Note that the optical distance between the two reflection layers disposed sandwiching the white organic EL layer may be adjusted to form a cavity structure, and the wavelength of the light emitted from the OLED 130 may be set. In this case, a color filter may or may not be provided.

When a current flows from the anode to the cathode of the OLED 130, holes injected from the anode and electrons injected from the cathode are recombined in the organic EL layer to generate excitons and generate white light. A configuration is adopted in which the white light generated at this time is transmitted through the cathode opposite to the silicon substrate (anode), colored using the color filter, and made visible on the observer side.

As illustrated in FIG. 3, the demultiplexer Dm(n) is an assembly of transmission gates 34 provided at each column, and supplies data signals in order to the three columns constituting each group. The input ends of the transmission gate 34 corresponding to columns (3n−2), (3n−1), and 3(n) belonging to the n-numbered groups are mutually connected in common and respective data signals Vd(n) are supplied to the common terminals. The output end of the transmission gate 34 corresponding to column (3n−2) is connected to the level shift circuit LS (3n−2) through the signal line 140 (3n−2). While a detailed illustration is omitted in FIG. 3, the output end of the transmission gate 34 corresponding to column (3n−1) is connected to the level shift circuit LS (3n−1) via the signal line 140 (3n−1), and the output end of the transmission gate 34 corresponding to column (3n) is connected to the level shift circuit LS (3n) through the signal line 140 (3n). The transmission gate 34 provided at column (3n−2) at the left end column in the re-numbered groups is turned on (conducts) when the control signal Sel(1) is an H level (when the control signal /Sel(1) is the L level). Similarly, the transmission gate 34 provided at column (3n−1) in the center column in the re-numbered groups is turned on when the control signal Sel(2) is the H level (when the control signal /Sel(2) is the L level), and the transmission gate 34 provided at column (3n) at the right end column in the n-numbered groups is turned on when the control signal Sel(3) is the H level (when the control signal /Sel(3) is the L level).

The level shift circuit LS (3n−2) includes storage capacitors 41, 44, a transmission gate 42, an N-channel MOS-type transistor 43, and a P-channel MOS-type transistor 45, and shifts the potential of the data signal outputted from the output end of the transmission gate 34 of column 3n−2. One end of the storage capacitor 44 is connected to the data transmission line 14 (3n−2) of the corresponding column and a drain of the transistor 45 while the other end of the storage capacitor 44 is connected to the output end of the transmission gate 42 and the drain of the transistor 43.

A source of the transistor 45 is connected to a feed line 61 supplying a predetermined initial potential Vini. The control circuit 3 supplies the control signal /Gini to a gate of the transistor 45. The transistor 45 is configured such that the data transmission line 14 (3n−2) and the feed line 61 are electrically connected when the control signal /Gini is the L level, and electrically unconnected when the control signal /Gini is the H level.

A source of the transistor 43 is connected to a feed line 62 supplying a potential Vref. The control signal Gref is supplied to a gate of the transistor 43. The transistor 43 is configured such that the other end of the storage capacitor 44 and the feed line 62 are electrically connected when the control signal Gref is the H level, and electrically unconnected when the control signal Gref is the L level.

One electrode of the storage capacitor 41 is connected to a signal line 140 (3n−2), and the signal line 140 (3n−2) is electrically connected to the input end of the transmission gate 42. The other electrode of the storage capacitor 41 of each column is commonly connected to a feed line 64. A potential VSS, which is a fixed potential, is supplied to the feed line 64. Here, the potential VSS may be equivalent to the L level of the scanning signal and the control signal, which are logic signals. When the transmission gate 34 is turned on, the data signal Vd(j) is supplied from the output end of the transmission gate 34 through the signal line 140 (3n−2) to one electrode of the storage capacitor 41. That is, in the storage capacitor 41, the data signal Vd(j) is supplied to one electrode. The control signal Gcpl and the control signal /Gcpl are supplied from the control circuit 3 to the transmission gate 42. The transmission gate 42 is turned on when the control signal Gcpl is the H level (when the control signal /Gcpl is the L level).

Figure 4:
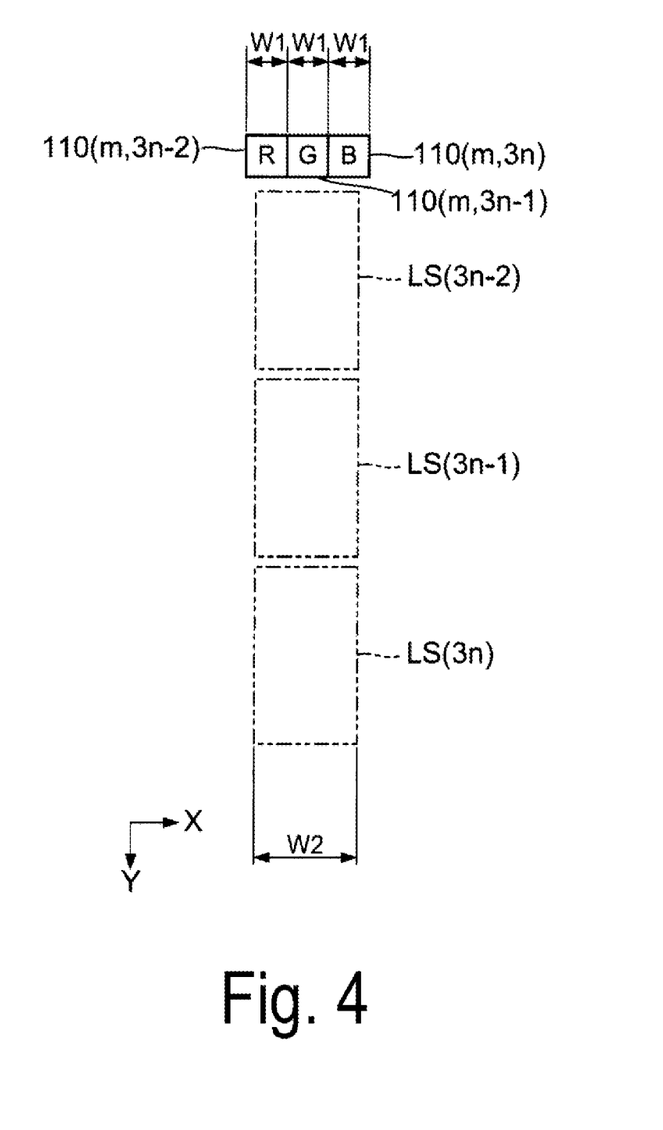
FIG. 4 is a diagram illustrating an arrangement example of the pixel circuit 110 and the level shift circuit LS in a display panel 10.

FIG. 4 illustrates an arrangement example in the display panel 10 of the pixel circuits 110 of row m belonging to the n-numbered groups (pixel circuits 110 (m, 3n−2), 110 (m, 3n−1), and 110 (m, 3n)), and the level shift circuits LS (3n−2), LS (3n−1), and LS (3n). As illustrated in FIGS. 2, 3, and 4, the level shift circuits LS (3n−2), LS (3n−1), and LS (3n) are disposed side-by-side in the column direction between the display unit 100 and the demultiplexer DM(n). More specifically, the level shift circuits LS are disposed in the order of LS (3n), LS (3n−1), and LS (3n−2) in the direction from the demultiplexer DM(n) toward the display unit 100. While the level shift circuits LS are disposed in the order of the LS (3n), LS (3n−1), and LS (3n−2) in the direction from the demultiplexer DM(n) toward the display unit 100 in the exemplary embodiment, the level shift circuits LS may be disposed in the order of LS (3n−2), LS (3n−1), and LS (3n). In short, the level shift circuits LS (3n−2), LS (3n−1), and LS (3n) may be disposed side-by-side in the column direction between the display unit 100 and the demultiplexer DM(n), and the order in which the level shift circuits LS (3n−2), LS (3n−1), and LS (3n) are disposed does not matter. In the following, the side away from the column direction (Y direction) as viewed from the display unit 100 is called the "upstream side", and the side close to the display unit 100 is called the "downstream side".

As illustrated in FIG. 4, in the exemplary embodiment, a length in the X direction of each of the pixel circuits 110 (m, 3n−2), 110 (m, 3n−1), and 110 (m, 3n) is W1, and a length in the X direction of each of the level shift circuits LS (3n−2), LS (3n−1), and LS (3n) is W2. Note that the size relationship between W1 and W2 is W1<W2<3×W1 as illustrated in FIG. 4, and a length in the Y direction of each of the level shift circuits LS (3n−2), LS (3n−2), and LS (3n) is greater than W2.

As illustrated in FIGS. 2 and 3, the level shift circuits LS (3n−2), LS (3n−1), and LS (3n) need to be disposed between the display unit 100 and the demultiplexer DM(n) in correspondence with the pixel circuits 110 belonging to the n-numbered groups. However, because W1<W2, the level shift circuits LS (3n−2), LS (3n−2), and LS (3n) cannot be disposed side-by-side in the row direction (X direction). In the exemplary embodiment, because W2<3×W1, when the level shift circuits LS (3n−2), LS (3n−1), and LS (3n) are disposed side-by-side in the column direction, the level shift circuits LS (3n−2), LS (3n−1), and LS (3n) can be disposed between the display unit 100 and the demultiplexer DM(n). Thus, in the exemplary embodiment, as illustrated in FIG. 4, the level shift circuits LS (3n−2), LS (3n−1), and LS (3n) are disposed side-by-side in the column direction (Y direction, that is, the direction of the data transmission line 14) on the upstream side of the display unit 100.

Figure 5:
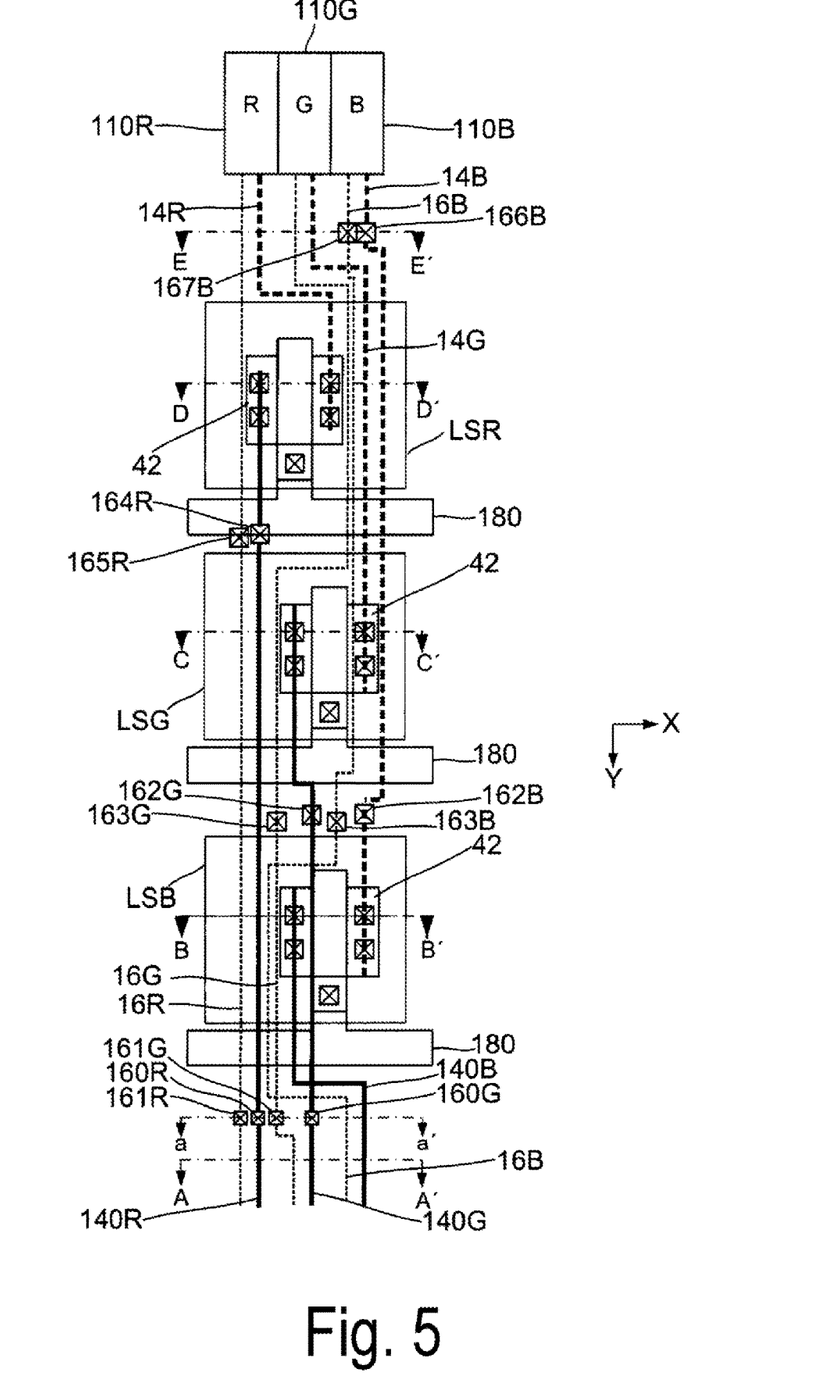
FIG. 5 is a diagram illustrating an example of wiring from the demultiplexer DM, through the level shift circuit LS, to the pixel circuit 110, in the display panel 10.

FIG. 5 is a diagram illustrating an example of the wiring from the level shift circuits LS (3n−2), LS (3n−1), and LS (3n) to the pixel circuits 110 (m, 3n−2), 110 (m, 3n−1), and 110 (m, 3n), respectively. In FIG. 5, among the constituent elements of each of the level shift circuits LS (3n−2), LS (3n−1), and LS (3n), only one of the two transistors that form the transmission gate 42 is illustrated (specifically, the N-channel transistor). Further, in FIG. 5, to avoid drawing complexities, the level shift circuit LS (3n−2), the level shift circuit LS (3n−1), and the level shift circuit LS (3n) are denoted by LSR, LSG, and LSB, respectively. Similarly for the pixel circuits 110 as well, the pixel circuit 110 (m, 3n−2), the pixel circuit 110 (m, 3n−1), and the pixel circuit 110 (m, 3n) are denoted by 110R, 110G, and 110B, respectively. Similarly for the data transmission lines 14 as well, the data transmission line 14 (3n−2), the data transmission line 14 (3n−1), and the data transmission line 14 (3n) are respectively denoted by 14R, 14G, and 14B. Then, similarly for the feed lines 16 as well, the feed line 16 (3n−2), the feed line 16 (3n−1), and the feed line 16 (3n) are respectively denoted as 16R, 16G, and 16B.

Figure 6:
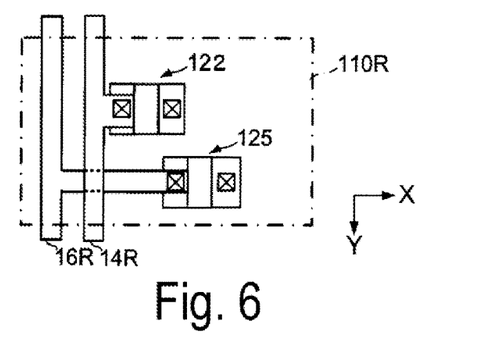
FIG. 6 is a diagram illustrating a wiring example of data transmission lines 14 and feed lines 16 in the pixel circuit 110.

FIG. 6 is a diagram illustrating a wiring example of the data transmission line 14R and the feed line 16R in the pixel circuit 110R. Note that, in FIG. 6, among the five transistors included in the pixel circuit 110R, only the second transistor 122 in which the source or the drain is connected to the data transmission line 14R, and the fifth transistor 125 in which the source or the drain is connected to the line feed 16R are schematically illustrated. The data transmission line 14R extends in the Y direction across the plurality of pixel circuits 110 of column (3n−2), and the feed line 16R also extends in the Y direction across the plurality of pixel circuits 110 of column (3n−2). As illustrated in FIG. 6, the feed line 16R in the display unit 100 is formed parallel with the data transmission line 14R at a predetermined distance from the data transmission line 14R, and the reset potential Vorst is applied as the second fixed potential to the feed line 16R. As a result, the feed line 16R serves as a shield line that shields the data transmission line 14R. Similarly, the feed line 16G is formed parallel with the data transmission line 14G at a predetermined distance from the data transmission line 14G, and the feed line 16B is formed parallel with the data transmission line 14B at a predetermined distance from the data transmission line 14B. Thus, the feed line 16G serves as a shield line that shields the data transmission line 14G, and the feed line 16B serves as a shield line that shields the data transmission line 14B.

FIGS. 7A, 7B, 8, 9, 10, and 11 are cross-sectional views taken along lines AA', aa', BB', CC', DD', and EE' in FIG. 5, respectively. In FIGS. 5 to 11, the signal line 140 from the demultiplexer DM(n) to the level shift circuit LSR is denoted by 140R. Similarly, the signal line 140 from the demultiplexer DM(n) to the level shift circuit LSG is denoted by 140G, and the signal line 140 from the demultiplexer DM(n) to the level shift circuit LSB is denoted by 140B.

As illustrated in FIGS. 7A to 11, the silicon substrate on which the display panel 10 is formed includes a first layer S1, a second layer S2, a third layer S3, and a fourth layer S4, each of these being a metal layer. Note that, in FIG. 7A, the fourth layer S4 is not illustrated. The area between the second layer S2 and the third layer S3, and the area between the third layer S3 and the fourth layer S4 are filled with an insulating inorganic material such as a silicon compound (typically, silicon nitride or silicon oxide), for example. While details will be described later, a signal line 180 connected to the gate of one of the two transistors forming the transmission gate 42 is formed in the first layer S1. The control signal Gcpl is applied from the control circuit 3 to this signal line 180. The first fixed potential VSS is applied to a portion other than the signal line 180 of the first layer S1. The first fixed potential VSS is also applied to the third layer S3. Note that the first fixed potential VSS and the reset potential Vorst, which is the second fixed potential described above, may be equivalent.

Figure 7A:
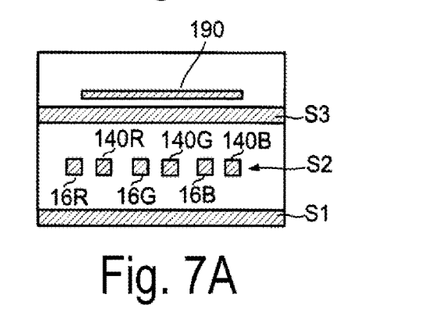
FIG. 7A is a partial cross-sectional view of the display panel 10.
Figure 7B:
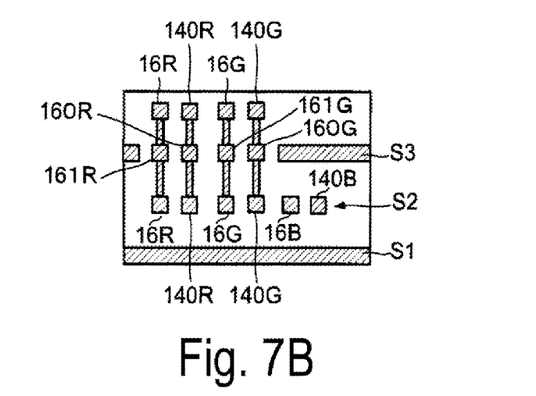
FIG. 7B is a partial cross-sectional view of the display panel 10.

The second layer S2 and the fourth layer S4 serve as wiring layers in which wiring respectively from the demultiplexer DM(n), through the level shift circuits LSR, LSG, LSB, and to the pixel circuits 110R, 110G, 110B is formed. As illustrated in FIGS. 7A and 7B, near the cutting-plane line AA', the signal line 140R, the signal line 140G, and the signal line 140B are formed in the second layer S2. More specifically, as illustrated in FIGS. 5 and 7A, near the cutting-plane line AA', the feed line 16R is formed along the signal line 140R, the feed line 16G is formed along the signal line 140G, and the feed line 16B is formed along the signal line 140B in the second layer S2. The feed line 16R serves as a shield line that shields the signal line 140R, the feed line 16G serves as a shield line that shields the signal line 140G, and the feed line 16B serves as a shield line that shields the data transmission line 14B. Further, as is clear upon comparison of FIGS. 8 to 11 and FIG. 7A, an electrode layer 190 is formed between the fourth layer S4 and the third layer S3 near the cutting-plane line AA'. In the exemplary embodiment, the storage capacitor 41 is formed by the electrode layer 190 and the third layer S3.

As illustrated in FIG. 7B, the signal line 140R is drawn from the second layer S2 to the fourth layer S4 through a relay electrode 160R (refer to FIG. 5) formed in the third layer S3 and peripherally insulated, and extends to the downstream side. Similarly, the signal line 140G is drawn from the second layer S2 to the fourth layer S4 through a relay electrode 160G formed in the third layer S3 and peripherally insulated, and extends to the downstream side. Similarly, the feed line 16R is drawn from the second layer S2 to the fourth layer S4 through a relay electrode 161R formed in the third layer S3 and peripherally insulated, and extends to the downstream side. Similarly, the feed line 16G is drawn from the second layer S2 to the fourth layer S4 through a relay electrode 161G formed in the third layer S3 and peripherally insulated, and extends to the downstream side.

The reset potential Vorst, which is the second fixed potential, is applied to the feed line 16R and the feed line 16G, and thus the feed line 16R and the feed line 16G function as shield lines. Given the feed line 16G on the upstream side of the cutting-plane line aa' as a first shield line, and the feed line 16G on the downstream side of the cutting-plane line aa' as a second shield line, the first shield line to which the second fixed potential is applied is positioned between the signal line 140R and the signal 140G in the second layer S2 equivalent to the first wiring layer. Further, the second shield line to which the second fixed potential is applied is positioned between the signal line 140R and the signal 140G in the fourth layer S4 equivalent to the second wiring layer. That is, the first shield line and the second shield line shield the area between the signal line 140R equivalent to the first signal line and the signal line 140G equivalent to the second signal line.

Further, the feed line 16G formed in the second layer S2 as the first shield line and the feed line 16G formed in the fourth layer S4 as the second shield line are connected through the relay electrode 161G formed in the third layer S3, which is a metal layer, and peripherally insulated.

Figure 8:
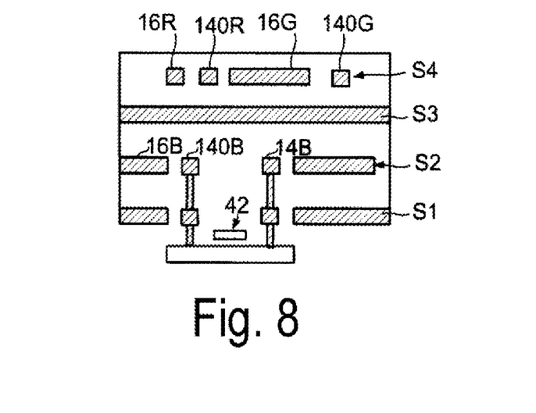
FIG. 8 is a partial cross-sectional view of the display panel 10.

The feed line 16R that shields the signal line 140R and the feed line 16G that shields the signal line 140G are formed in the fourth layer as illustrated in FIG. 8. The feed line 16R and the feed line 16G formed in the fourth layer S4 function as shield lines. The signal line 140B extends toward the level shift circuit LSB in the second layer S2, and is connected to the input end of the transmission gate 42 in the level shift circuit LSB, as illustrated in FIGS. 5 and 8. The data transmission line 14B formed in the second layer S2 and extending toward the downstream side is connected to the output end of the transmission gate 42 of the level shift circuit LSB, as illustrated in FIGS. 5 and 8.

Figure 9:
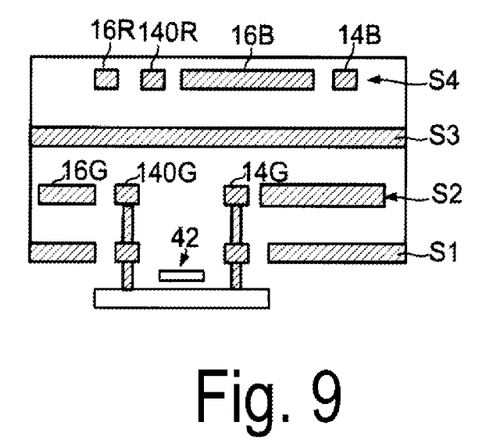
FIG. 9 is a partial cross-sectional view of the display panel 10.

The signal line 140G drawn to the fourth layer S4 through the relay electrode 160G (refer to FIG. 5) and extending to the downstream side is drawn to the second layer S2 through a relay electrode 162G (refer to FIG. 5) formed in the third layer S3 and peripherally insulated, and extends to the downstream side. The signal line 140G drawn to the second layer S2 through the relay electrode 162G and extending to the downstream side is connected to the input end of the transmission gate 42 in the level shift circuit LSG, as illustrated in FIGS. 5 and 9. The data transmission line 14G formed in the second layer S2 and extending toward the downstream side is connected to the output end of the transmission gate 42 of the level shift circuit LSG, as illustrated in FIGS. 5 and 9. The data transmission line 14G extending toward the downstream side in the second layer S2 reaches the pixel circuit 110G (refer to FIG. 5). The feed line 16G extending downstream in the fourth layer S4 is drawn to the second layer S2 through a relay electrode 163G (refer to FIG. 5) formed in the third layer S3 and peripherally insulated, and reaches the pixel circuit 110G (refer to FIG. 5). The data transmission line 14B extending to the downstream side in the second layer S2 is drawn to the fourth layer S4 through the relay electrode 162B (refer to FIG. 5) formed in the third layer S3 and peripherally insulated, and extends to the downstream side. The feed line 16B extending to the downstream side in the second layer S2 is drawn to the fourth layer S4 through a relay electrode 163B formed in the third layer S3 and peripherally insulated, and extends to the downstream side (refer to FIG. 5).

Figure 10:
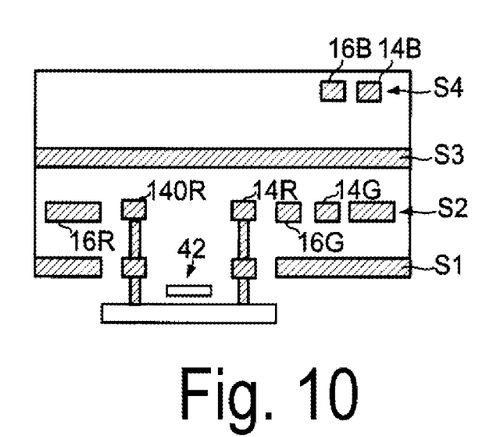
FIG. 10 is a partial cross-sectional view of the display panel 10.

The signal line 140R drawn to the fourth layer S4 through the relay electrode 160R and extending to the downstream side is drawn to the second layer S2 through a relay electrode 164R (refer to FIG. 5) formed in the third layer S3 and peripherally insulated, and extends to the downstream side. The signal line 140R drawn to the second layer S2 through the relay electrode 164R and extending to the upstream side is connected to the input end of the transmission gate 42 of the level shift circuit LSR, as illustrated in FIGS. 5 and 10. The data transmission line 14R formed in the second layer S2 and extending toward the downstream side is connected to the output end of the transmission gate 42 of the level shift circuit LSR (refer to FIGS. 5 and 10). The data transmission line 14R extends toward the downstream side in the second layer S2 and reaches the pixel circuit 110R (refer to FIG. 5). The feed line 16R drawn to the fourth layer S4 through the relay electrode 161R and extending to the downstream side is also drawn to the second layer S2 through a relay electrode 165R (refer to FIG. 5) formed in the third layer S3 and peripherally insulated, extends to the downstream side in the second layer S2, and reaches the pixel circuit 110R.

Figure 11:
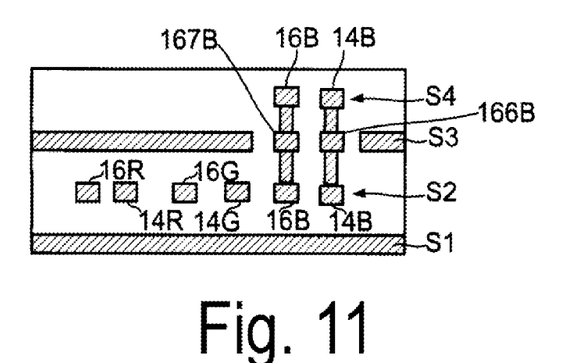
FIG. 11 is a partial cross-sectional view of the display panel 10.

The data transmission line 14B drawn to the fourth layer S4 through the relay electrode 162B and extending to the downstream side is drawn to the second layer S2 through a relay electrode 166B formed in the third layer S3 and peripherally insulated, as illustrated in FIGS. 5 and 11. The data transmission line 14B drawn to the second layer S2 through the relay electrode 166B extends to the downstream side and reaches the pixel circuit 110B (refer to FIG. 5). The feed line 16B drawn to the fourth layer S4 through the relay electrode 163B and extending to the downstream side is drawn to the second layer S2 through a relay electrode 167B formed in the third layer S3 and peripherally insulated, as illustrated in FIGS. 5 and 11. The feed line 16B drawn to the second layer S2 through the relay electrode 167B extends to the downstream side and reaches the pixel circuit 110B (refer to FIG. 5).

As illustrated in FIGS. 7A to 10, in the exemplary embodiment, the signal line 140B is formed in the second layer S2 only, and the signal line 140R and the signal line 140G are each partially formed in the fourth layer S4. Specifically, the signal line 140R is formed in the fourth layer S4 in a section from the relay electrode 160R to the relay electrode 164R, and the signal line 140G is formed in the fourth layer S4 in the section from the relay electrode 160G to the relay electrode 162G. The cutting plane from the cutting-plane line BB' is an example of a cutting plane of the section from the relay electrode 160G to the relay electrode 162G. In this section, as illustrated in FIG. 8, the signal line 140R and the signal line 140G are formed in the fourth layer S4, and the signal line 140B and the data transmission line 14B are formed in the second layer S2. The third layer S3, which is a metal layer to which the first fixed potential VSS is applied, is provided between the second layer S2 and the fourth layer S4, and has a shielding function. Thus, crosstalk between the signal line 140B or the data transmission line 14B and the signal line 140R in the section from the relay electrode 160G to the relay electrode 162G is suppressed. Similarly, crosstalk between the signal line 140B or the data transmission line 14B and the signal line 140G is also suppressed.

The cutting plane from the cutting-plane line CC' is an example of a cutting plane of the section from the relay electrode 162G to the relay electrode 164R. In this section, as illustrated in FIG. 9, the signal line 140R and the data transmission line 14B are formed in the fourth layer S4, and the signal line 140G and the data transmission line 14G are formed in the second layer S2. Thus, crosstalk between the signal line 140G or the data transmission line 14G and the signal line 140R in the section from the relay electrode 162G to the relay electrode 164R is suppressed, and crosstalk between the signal line 140G or the data transmission line 14G and the data transmission line 14B is suppressed. Further, the cutting plane from the cutting-plane line DD' is an example of a cutting plane of the section from the relay electrode 16R4 to the relay electrode 166B. In this section, as illustrated in FIG. 10, the data transmission line 14B is formed in the fourth layer S4, and the signal line 140R and the data transmission line 14R are formed in the second layer S2. Thus, crosstalk between the signal line 140R or the data transmission line 14R and the data transmission line 14B is suppressed. The data transmission line 14R and the data transmission line 14G are shielded by the feed line 16G.

As described above, on the upstream side of the line AA' in FIG. 5, the signal lines 140R, 140G, and 140B are respectively shielded by the feed lines 16R, 16G, and 16B serving as shield lines, suppressing crosstalk between the signal lines. Further, on the downstream side of the line EE' in FIG. 5, the data transmission lines 14R, 14G, and 14B are respectively shielded by the feed lines 16R, 16G, and 16B serving as shield lines, suppressing crosstalk. In the exemplary embodiment, crosstalk is suppressed across all sections from the demultiplexer DM(n) through the level shift circuits LSR, LSG, and LSB, and to the pixel circuits 110R, 110G, 110B, and thus a reduction in display quality does not occur. Further, in the exemplary embodiment, the level shift circuits LSR, LSG, and LSB are disposed side-by-side in the column direction on the upstream side of the display unit 100, making it possible to support the narrowing of the pitch of the pixel circuits 110 in the X direction and provide higher definition in the electro-optical device 1.

Note that, on the downstream side of the cross-sectional line EE', that is, in the display unit 100, the data transmission lines 14R, 14G, and 14B and the feed lines 16R, 16G, and 16B are formed in the second layer S2. More specifically, the feed line 16R is formed parallel with the data transmission line 14R at a predetermined distance from the data transmission line 14R (refer to FIG. 6). Similarly, the feed line 16G is formed parallel with the data transmission line 14G at a predetermined distance from the data transmission line 14G, and the feed line 16B is formed parallel with the data transmission line 14B at a predetermined distance from the data transmission line 14B. The capacitor 50 between the data transmission line 14R and the feed line 16R is formed by arranging the data transmission line 14R and the feed line 16R serving as a shield line in the gap formed by the predetermined distance through an insulation material constituting the second layer S2. The same holds true for the capacitor 50 between the data transmission line 14G and the feed line 16G as well as the capacitor 50 between the data transmission line 14B and the feed line 16B. That is, the capacitor 50 between the data transmission line 14G and the feed line 16G is formed by arranging the data transmission line 14G and the feed line 16G serving as a shield line in the gap formed by the predetermined distance through the insulation material constituting the second layer S2. The capacitor 50 between the data transmission line 14B and the feed line 16B is formed by arranging the data transmission line 14B and the feed line 16B serving as the shield line in the gap formed by the predetermined distance through the insulation material constituting the second layer S2. The capacitor 50 is formed by two parallel wires, and thus has a predetermined length in the Y direction and can maintain a predetermined capacitance. Further, the capacitor 50 is formed within the display region of the pixel circuit 110, and can therefore prevent an increase in a chip surface area.

B. Modifications

While an exemplary embodiment of the invention has been described above, this exemplary embodiment may be variously modified as follows.

(1) The electro-optical device 1 of the exemplary embodiment described above includes the third layer S3 having a shielding function between the second layer S2 serving as the first wiring layer, and the fourth layer S4 serving as the second wiring layer. However, when the level shift circuit LSG serves as the first circuit, the level shift circuit LSB serves as the second circuit, the signal line 140G serves as the first signal line, and the signal line 140B serves as the second signal line, the third layer S3 may be omitted as long as the crosstalk between both signal lines can be adequately suppressed by wiring at least a portion of the first signal line in a wiring layer different from that of the second signal line, as illustrated in FIGS. 8 and 9. Further, the same holds true for the feed line 16 serving as the shield line as well. That is, the shield line may be omitted as long as the crosstalk between both signal lines can be adequately suppressed by wiring at least a portion of the first signal line in a wiring layer different from that of the second signal line. In the example illustrated in FIGS. 8 and 9, with the second data transmission line (data transmission line 14B, for example) disposed side-by-side with the first data transmission line (data transmission line 14G, for example) as well, at least a portion thereof is disposed in a wiring layer different from that of the first data transmission line. Note that the first data transmission line is a signal line for supplying a data signal indicating a display gradation from the first circuit (level shift circuit LSG) to the first pixel circuit (pixel circuit 110G, for example), and the second data transmission line is a signal line for supplying a data signal indicating a display gradation from the second circuit (level shift circuit LSB) to the second pixel circuit (pixel circuit 110B, for example).

(2) The electro-optical device of the exemplary embodiment described above includes the electrode 190 between the second wiring layer (fourth layer S4) and the third layer S3, and the storage capacitor 41 is formed by the electrode 190 and the third layer S3. However, the electrode 190 may be omitted, and the storage capacitor 41 may be separately provided.

(3) While, in the electro-optical device 1 of the exemplary embodiment described above, the data transmission line 14 and the feed line 16 formed in parallel with the data transmission line 14 at a predetermined distance from the data transmission line 14 serve as the capacitor 50, the capacitor may be separately provided.

(4) In the electro-optical device of the exemplary embodiment described above, the first feed line (feed line 16 formed in the second layer S2) serving as a shield line in the first wiring layer (second layer S2) and the second feed line (feed line 16 formed in the fourth layer S4) serving as a shield line in the second wiring layer (fourth layer S4) are connected through the relay electrode formed in the third layer S3, which is a metal layer, and peripherally insulated. However, the first feed line and the second feed line may not be connected through the relay electrode.

C. Application Examples

The electro-optical device according to the exemplary embodiment described above may be applied to various electronic apparatuses, and is preferably applied to an electronic apparatus that requires a high-definition image display of 2K or greater as well as a small size, in particular. Hereinafter, the electronic apparatus according to the invention will be described.

Figure 12:
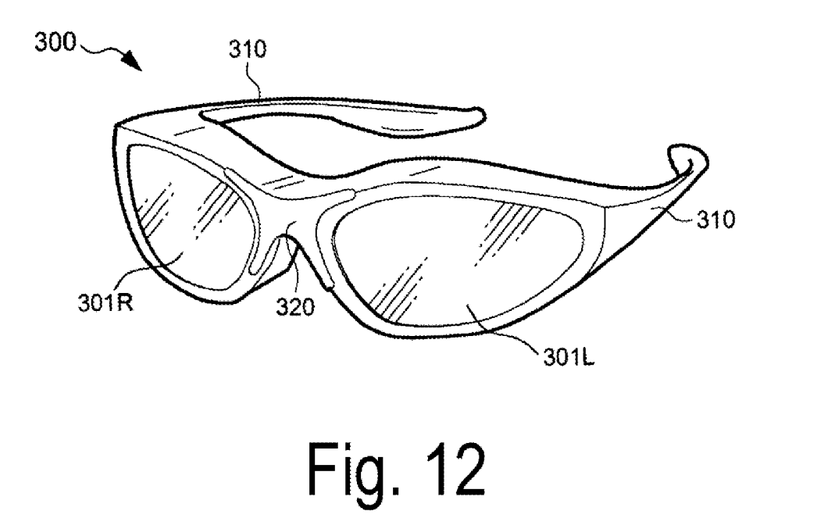
FIG. 12 is a perspective view of a head mounted display 300 according to the invention.

FIG. 12 is a perspective view illustrating an outer appearance of a head mounted display 300 as an electronic apparatus employing the electro-optical device 1 of the invention. As illustrated in FIG. 12, the head mounted display 300 includes a temple 310, a bridge 320, a projection optical system 301L, and a projection optical system 301R. Then, in FIG. 12, the electro-optical device 1 (not illustrated) for the left eye is provided behind the projection optical system 301L, and the electro-optical device 1 (not illustrated) for the right eye is provided behind the projection optical system 301R.

Figure 13:
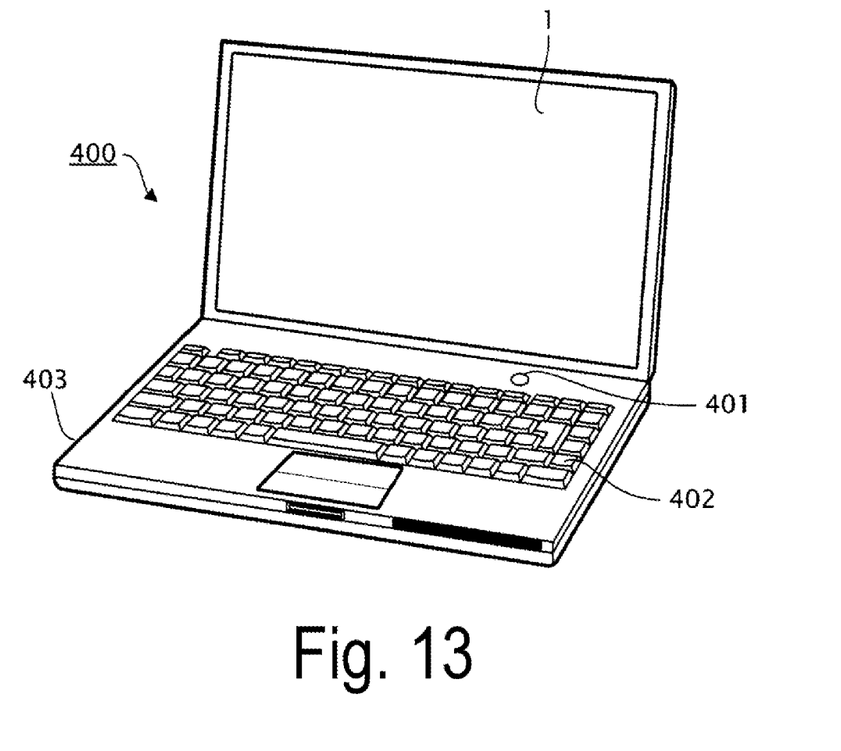
FIG. 13 is a perspective view of a personal computer 400 according to the invention.

FIG. 13 is a perspective view of a portable personal computer 400 employing the electro-optical device 1 according to the invention. The personal computer 400 includes the electro-optical device 1 for displaying various images, and a main body unit 403 provided with a power switch 401 and a keyboard 402. Note that, as an electronic apparatus to which the electro-optical device 1 according to the invention is applied, in addition to the apparatuses exemplified in FIGS. 12 and 13, it is also possible to use a portable telephone, a smartphone, a personal digital assistant (PDA), a digital still camera, and a video camera. Additionally, as the electronic apparatus to which the electro-optical device according to the invention is applied, it is also possible to use a television, a car navigation device, an in-vehicle display device (instrument panel), an electronic viewfinder, an electronic notebook, an electronic paper, a calculator, a word processor, a workstation, a video phone, a POS terminal, and the like. Furthermore, the electro-optical device according to the invention may be applied as a display unit provided in an electronic apparatus such as a printer, a scanner, a copying machine, and a video player.

The entire disclosure of Japanese Patent Application No. 2018-010420, filed Jan. 25, 2018 is expressly incorporated by reference herein.

What is claimed is:

1. An electro-optical device comprising:
   a first circuit configured to supply a first data signal to a first pixel circuit through a first data transmission line;
   a second circuit configured to supply a second data signal to a second pixel circuit through a second data transmission line;
   a first signal line connected to the first circuit; and
   a second signal line connected to the second circuit, wherein
   the first circuit and the second circuit are disposed side-by-side in a first direction that the first data transmission line extends in plan view,
   the first pixel circuit and the second pixel circuit are disposed side-by-side in a second direction that intersects with the first direction in plan view, and
   in a third direction that is perpendicular to both the first direction and the second direction, the first signal line is provided in a wiring layer that differs from a layer in which the second signal line is provided.

2. The electro-optical device according to claim 1, wherein
   in the third direction, the first data transmission line is provided in a wiring layer that differs from a layer in which the second data transmission line is provided.

3. The electro-optical device according to claim 2, further comprising:

a first wiring layer and a second wiring layer, wherein
the first data transmission line is shorter than the second data transmission line,
in the first circuit, the first data transmission line and the first signal line are provided in the first wiring layer, and the second data transmission line is provided in the second wiring layer, and
in the second circuit, the second data transmission line and the second signal line are provided in the first wiring layer, and the first signal line is provided in the second wiring layer.

4. The electro-optical device according to claim 3, further comprising
a metal layer imparted with a first fixed potential between the first wiring layer and the second wiring layer.

5. The electro-optical device according to claim 4, further comprising:
an electrode layer provided between the metal layer and the second wiring layer, wherein
the electrode layer constitutes along with the metal layer a first storage capacitor configured to hold a voltage corresponding to a display gradation of the first pixel circuit, and a second storage capacitor configured to hold a voltage corresponding to a display gradation of the second pixel circuit.

6. The electro-optical device according to claim 3, further comprising:
a first shield line imparted with a second fixed potential, the first shield line being provided between the first signal line and the second signal line in the first wiring layer; and
a second shield line imparted with the second fixed potential, the second shield line being provided between the first signal line and the second signal line in the second wiring layer.

7. The electro-optical device according to claim 6, wherein
the first shield line and the second shield line are formed in the metal layer and are connected through a relay electrode that is peripherally insulated.

8. An electro-optical device comprising:
a first circuit configured to supply a first data signal to a first pixel circuit through a first data transmission line;
a second circuit configured to supply a second data signal to a second pixel circuit through a second data transmission line;
a first signal line connected to the first circuit; and
a second signal line connected to the second circuit, wherein
the first circuit and the second circuit are disposed side-by-side in a first direction that the first data transmission line extends in plan view, and
the first pixel circuit and the second pixel circuit are disposed side-by-side in a second direction that intersects with the first direction in plan view, and
in a third direction that is perpendicular to both the first direction and the second direction, in a second region that the second circuit is provided, the second signal line is provided in a first wiring layer, and the first signal line is provided in a second wiring layer different from the first wiring layer.

9. The electro-optical device according to claim 8, wherein
in the third direction, in a first region that the first circuit is provided, the first data transmission line and the first signal line are provided in the first wiring layer, and the second data transmission line is provided in the second wiring layer, and
in the third direction, in the second region, the second data transmission line is provided in the first wiring layer.

10. An electronic apparatus comprising the electro-optical device described in claim 1.

11. An electronic apparatus comprising the electro-optical device described in claim 8.

12. An electro-optical device comprising:
a first circuit configured to supply a first data signal to a first pixel circuit through a first data transmission line;
a second circuit configured to supply a second data signal to a second pixel circuit through a second data transmission line;
a first signal line connected to the first circuit;
a second signal line connected to the second circuit; and
a first wiring layer and a second wiring layer,
wherein
the first circuit and the second circuit are disposed side-by-side in a direction that the first data transmission line extends,
one of the first signal line and the second signal line is at least partially provided in a wiring layer that differs from that of the other,
at least one of the first data transmission line and the second data transmission line is partially provided in a wiring layer that differs from that of the other,
the first data transmission line is shorter than the second data transmission line,
in the first circuit, the first data transmission line and the first signal line are provided in the first wiring layer, and the second data transmission line is provided in the second wiring layer, and
in the second circuit, the second data transmission line and the second signal line are provided in the first wiring layer, and the first signal line is provided in the second wiring layer.

* * * * *